United States Patent
Liu et al.

(10) Patent No.: US 7,592,847 B2
(45) Date of Patent: Sep. 22, 2009

(54) PHASE FREQUENCY DETECTOR AND PHASE-LOCKED LOOP

(75) Inventors: Shen-luan Liu, Taipei (TW); Che-Fu Liang, Taipei (TW); Hsin-Hua Chen, Taipei (TW)

(73) Assignee: Mediatek Inc., Hsin-Chu (TW)

( * ) Notice: Subject to any disclaimer, the term of this patent is extended or adjusted under 35 U.S.C. 154(b) by 119 days.

(21) Appl. No.: 11/861,505

(22) Filed: Sep. 26, 2007

(65) Prior Publication Data

US 2008/0231324 A1    Sep. 25, 2008

Related U.S. Application Data

(60) Provisional application No. 60/896,285, filed on Mar. 22, 2007.

(51) Int. Cl.
    *H03L 7/00* (2006.01)
(52) U.S. Cl. .................... 327/162; 327/163; 327/12
(58) Field of Classification Search ............ 327/156, 327/157, 162, 163, 147, 148, 3, 12, 39–43
    See application file for complete search history.

(56) References Cited

U.S. PATENT DOCUMENTS

| 5,530,383 | A  | * | 6/1996  | May .......................... 327/39 |
| 6,285,219 | B1 | * | 9/2001  | Pauls ........................... 327/3 |
| 6,407,642 | B2 | * | 6/2002  | Dosho et al. ................ 331/11 |
| 6,642,747 | B1 | * | 11/2003 | Chiu ........................... 327/40 |

OTHER PUBLICATIONS

"Challenges in the design of frequency synthesizers for wireless applications" B. Razavi, May 1997, pp. 395-402.
"A 13.5-mW 5-GHz frequency synthesizer with dynamic-Logic frequency divider" S. Pellerano et al., Feb. 2004, pp. 378-383.
"An integrated CMOS RF synthesizer for 802.11a wireless LAN" F. Herzel et al., Oct 2003, pp. 1767-1770.
"A digitally calibrated 5.15-5.825GHz transceiver for 802.11a wireless LANs in 0.18μm CMOS" I. Bouras et al., Feb. 2003, pp. 352-353.
"A direct conversion CMOS transceiver for IEEE 802.11a WLANs" P. Zhang, Feb. 2003, pp. 354-355.

(Continued)

*Primary Examiner*—Lincoln Donovan
*Assistant Examiner*—Hai L Nguyen
(74) *Attorney, Agent, or Firm*—Thomas, Kayden, Horstemeyer & Risley

(57) ABSTRACT

A phase frequency detector with two different delays is disclosed herein. The phase detector comprises a first D flip-flop, a second D flip-flop, a first delay unit and a second delay unit. The first D flip-flop receives a reference signal to output an up signal. The second D flip-flop receives a clock signal to output a down signal. The first delay unit delays the received signal with a first delay. The second delay unit delays the received signal with a second delay. When the reference signal synchronizes with the clock signal and the charge pump currents are calibrated, the high-level pulse widths of the up signal and the down signal are determined based on the first delay, and when the reference signal does not synchronize with the clock signal and the charge pump currents are not calibrated, the high-level pulse widths of the up signal and the down signal are determined based on the second delay.

20 Claims, 12 Drawing Sheets

OTHER PUBLICATIONS

"A 900MGHz local oscillator using a DLL-based frequency multiplier technique for PCD applications" Feb. 2000, pp. 202-203.

"A low-power small-area 7.28-ps-jitter 1-GHz DLL-based clock generator" C. Kim, Dec. 2002, pp. 1414-1420.

"The design and analysis of a DLL-based frequency synthesizer for UWB application" T.C. Lee, Jun. 2006, pp. 1245-1252.

"Challenges in the design of high-speed clock and data recovery circuits" B. Razavi, Aug. 2002, pp. 94-101.

"A CMOS dual-band fractional-N synthesizer with reference doubler and compensated charge pump" H. Huh et al., Feb. 2004, pp. 100-101.

"A subpicosecond jitter PLL for clock generation in 0.12μm digital CMOS" N.D. Dalt et al., Jul. 2003, pp. 1275-1278.

"Design and analysis of an ultrahigh-speed glitch-free fully differential charge pump with minimum output current variation and accurate matching" S. Cheng et al., Sep. 2006, pp. 843-847.

"Fast frequency acquisition phase-frequency detectors for Gsamples/s phase-locked loops" M. Mansuri et al., Oct. 2002, pp. 1331-1334.

"Nonredundant successive approximation register for A/D converters" A. Rossi et al., Jun. 1996, pp. 1055-1057.

"Frequency dependence on bias current in 5 GHz CMOS VCOs impact on tuning range and flicker noise upconversion" S. Laventino et al., Aug. 2002, pp. 1003-1011.

"A 10-Gb/s CDR/DEMUX with LC delay line VCO in 0.18μm CMOS" J.E. Rogers et al., Dec. 2002, pp. 1781-1789.

"Clock-deskew buffer using a SAR-controlled delay-locked loop" G.K. Dehng, Aug. 2000, pp. 1128-1136.

"A 40~550MHz harmonic-free all-digital delay-locked loop using variable SAE algorithm" R.J. Yang et al., to be published, Feb. 2007, pp. 361-373.

"A Calibrated PhaseFrequency Detector for Reference Spur Reduction in Charge-Pump PLLS", Charles et al., Sep. 2006, pp. 822-826.

"Design of high-performance CMOS charge pumps in phase-locked loops", Rhee, (no month) 1999, pp. 545-548.

"Modeling and experimental verification of substrate coupling and isolation techniques in mixed-signals ICs on a lightly-doped substrate", Van der Plas et al., (no month) 2005 pp. 280-283.

"A 2.6-GHz 5.2-GHz Frequency Syhthesizer in 0.4-mm CMOS Technology" Christopher Lam et al., May 2000, pp. 788-794.

* cited by examiner

US 7,592,847 B2

PHASE FREQUENCY DETECTOR AND PHASE-LOCKED LOOP

CROSS REFERENCE TO RELATED APPLICATIONS

This application claims the benefit of U.S. Provisional Application No. 60/896,285, filed at Mar. 22, 2007, incorporated herein by reference.

BACKGROUND OF THE INVENTION

1. Field of the Invention

The present invention relates to a phase-locked loop device and more particularly to a phase-locked loop device with switched-delay phase frequency detector.

2. Description of the Related Art

A phase-locked loop (PLL) device, is a major component applied in frequency generators, wireless receivers, communication devices and so on. Referring to FIG. 1. FIG. 1 is a schematic diagram of a conventional PLL device. PFD unit 11 receives a reference clock signal REF_CK and a feedback clock signal FBK_CK and measures the phase and frequency difference therebetween to output phase difference signals, UP and DN. Charge pump circuit 12 receives and transforms the phase difference signals UP and DN into a current to charge loop filter 13. In FIG. 1, a circuit of a conventional loop filter 13 is provided. The loop filter 13 receives the current from charge pump circuit to limit the rate of change of a capacitor voltage, VCON, resulting in slow rising or falling voltage corresponding to the phase and frequency differences. The voltage-controlled oscillator (VCO) 14 generates an output clock signal according to the voltage VCON. Feedback divider 15 has a parameter N to generate the feedback clock signal FBK_CK, wherein the period of the feedback clock signal FBK_CK is N times the period of the output clock signal. In an ideal situation, when the PLL is in in-lock state, the phase difference signal UP synchronizes to the phase difference signal DN.

FIG. 2 is a schematic diagram of a phase frequency detector and charge pump circuit. The phase frequency detector 21 comprises a first D flip-flop 23, a second D flip-flop 24, an AND gate 26 and a delay unit 25 with a delay $T_d$. The phase frequency detector 21 output two signals UP and DN to control the charge pump circuit 22. When the phase frequency detector 21 and the charge pump circuit is locked in a PLL device, the timing diagram of a related signal of the phase frequency detector 21 is shown in FIG. 3, where the high-level pulse widths of signals UP or DN respectively are $T_{pup}$ and $T_{pdn}$. Assume the signals UP and DN are perfectly matched, in other words, $I_{up}=I_{dn}=I$ and $T_{pup}=T_{pdn}=T_d$. When a PLL device is locked, the voltage on the loop filter is fixed because the net charge provided by the charge pump circuit should be zero. To maintain the locked condition, the following equation is satisfied:

$$I_{up} \cdot T_{pup} = I_{dn} \cdot T_{pdn} \qquad (1)$$

However, if the current $I_{up}$ and $I_{dn}$ are not matched, to satisfy the equation (1), the pulse widths $T_{pup}$ and $T_{pdn}$ need to be adjusted. Assume that the down current $I_{dn}$ is only 80% of the up current $I_{up}$, i.e. $I_{dn}=0.8 \cdot I_{up}$. To satisfy the equation (1), the pulse width $T_{pdn}$ is 125% of the pulse width $T_{pup}$. Because the phase frequency detector 21 aligns the falling edges of the signals UP and DN, the rising edge of the signal DN leads the rising edge of the signal UP due to the different pulse widths $T_{pup}$ and $T_{pdn}$. If the duration of the pulse width $T_{pup}$ is 1 ns, it results in a static phase error of 0.25 ns. Similarly, if the down current $I_{dn}$ is smaller than the up current $I_{up}$, the rising edge of the signal UP therefore leads the rising edge of the signal DN due to the different pulse widths $T_{pup}$ and $T_{pdn}$.

BRIEF SUMMARY OF THE INVENTION

An embodiment of the invention provides a phase-locked loop comprising a switched-delay phase frequency detector, a charge pump circuit, a loop filter and a voltage-controlled oscillator. The phase frequency detector with switched-delay measures a reference signal and a clock signal of the PLL device to output an up signal and a down signal. The charge pump circuit receives and transforms the up signal and the down signal into a current. The loop filter receives and transforms the current into a voltage. The voltage-controlled oscillator receives the voltage and outputs the clock signal. Wherein when the reference signal synchronizes with the clock signal and the charge pump currents are calibrated, the high-level pulse widths of the up signal and the down signal are determined based on a first delay, and when the reference signal does not synchronize with the clock signal and the charge pump currents are not calibrated, the high-level pulse widths of the up signal and the down signal are determined based on a second delay.

Another embodiment of the invention provides a phase detector comprising a first D flip-flop, a second D flip-flop, a first delay unit and a second delay unit. The first D flip-flop receives a reference signal to output an up signal. The second D flip-flop receives a clock signal to output a down signal. The first delay unit delays the received signal with a first delay. The second delay unit delays the received signal with a second delay. When the reference signal synchronizes with the clock signal and the charge pump currents are calibrated, the high-level pulse widths of the up signal and the down signal are determined based on the first delay, and when the reference signal does not synchronize with the clock signal and the charge pump currents are not calibrated, the high-level pulse widths of the up signal and the down signal are determined based on the second delay.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
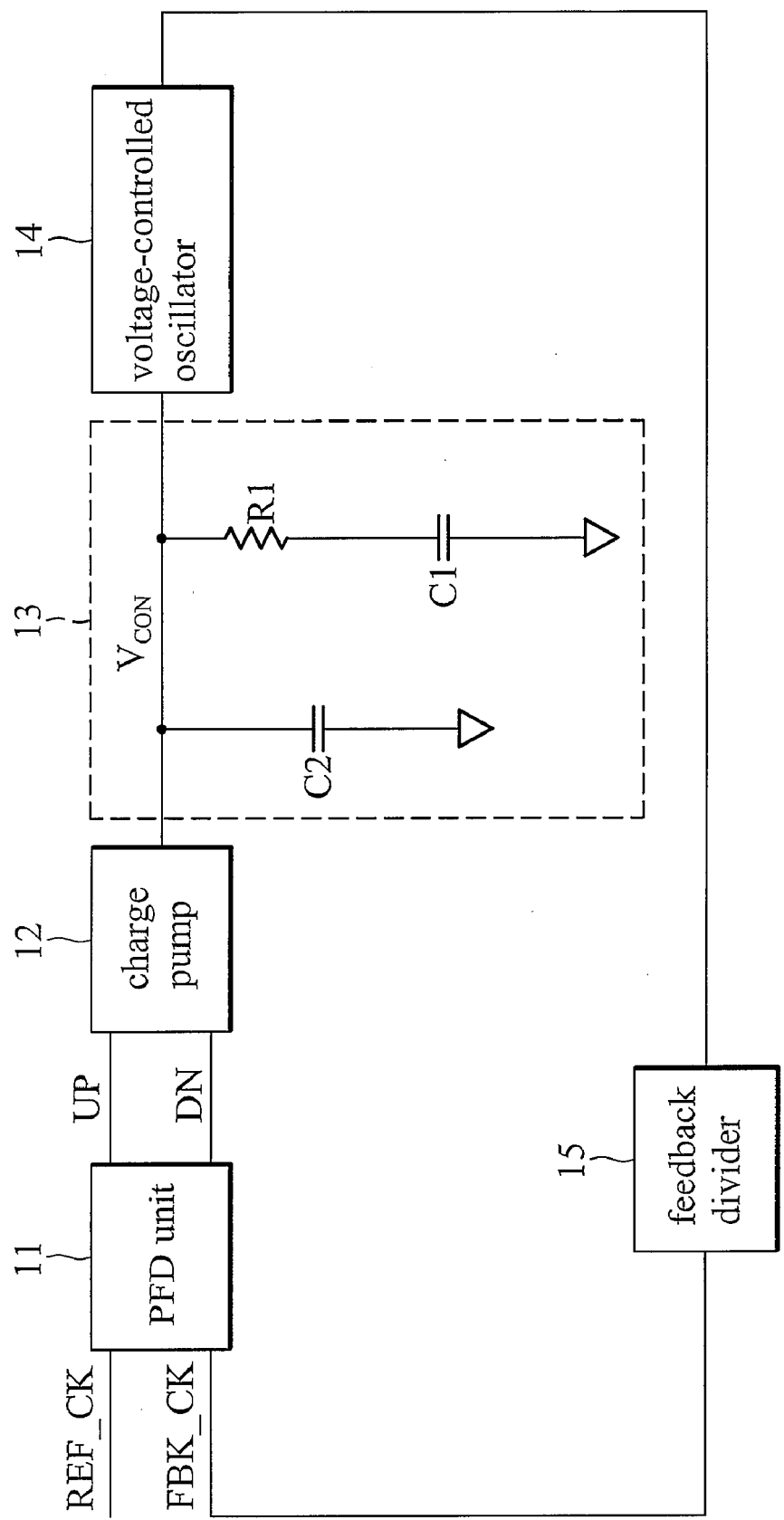
FIG. 1 is a schematic diagram of a conventional PLL device.
Figure 2:
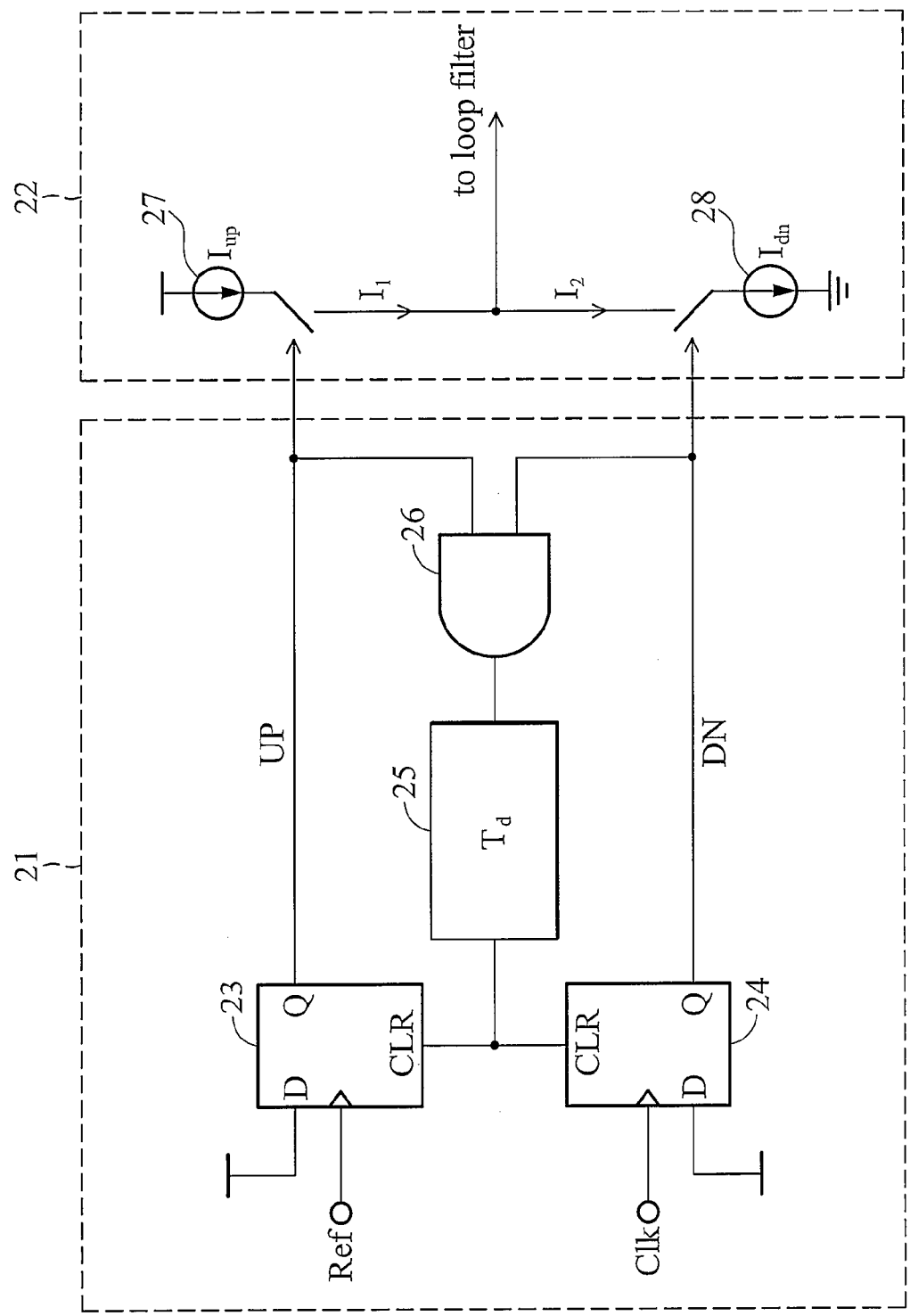
FIG. 2 is a block diagram of a conventional phase frequency detector and a conventional charge pump circuit.
Figure 3:
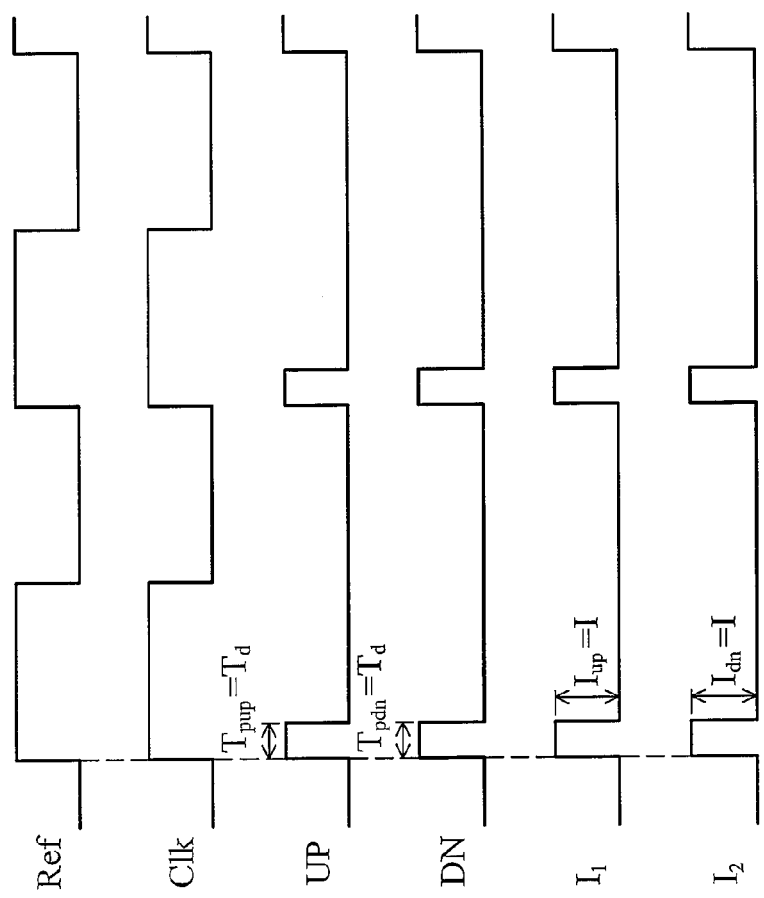
FIG. 3 is a timing diagram of the phase frequency detector and the charge pump circuit in FIG. 2.
Figure 4:
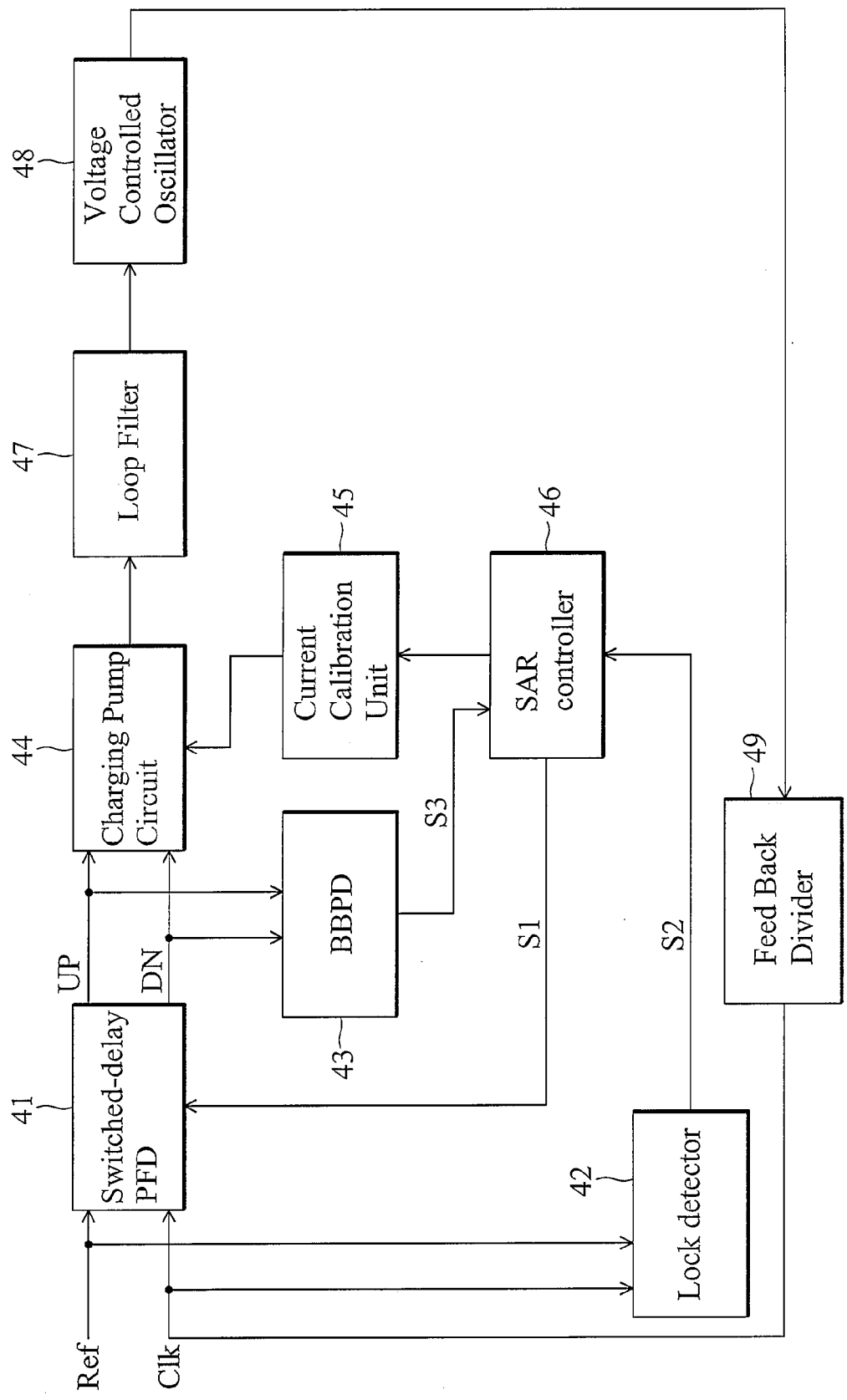
FIG. 4 is a block diagram of a PLL device with switched-delay phase frequency detector in accordance with an embodiment of the invention

FIG. 4 is a block diagram of a PLL device with switched-delay phase frequency detector in accordance with an embodiment of the invention. The PLL device comprises a switched-delay phase frequency detector 41, a lock detector 42, a bang bang phase detector (BBPD) 43, a charge pump circuit 44, a current calibration unit 45, a SAR controller 46, a loop filter 47, a voltage-controlled oscillator 48 and a feedback divider 49. The switched-delay phase frequency detector 41 receives a reference clock signal Ref and a feedback clock signal Clk and measures the phase and frequency difference therebetween to output an up signal (UP) and a down signal (DN). The switched-delay phase frequency detector 41 comprises at least two different delay times, the first delay $T_d$ and the second delay $T_{d\_en}$. When the reference clock signal Ref does not synchronize with the feedback clock signal Clk and the charge pump currents are not calibrated, the switched-delay phase frequency detector selects the second delay $T_{d\_en}$, wherein the first delay $T_d$ is smaller than the second delay $T_{d\_en}$.

The lock detector 42 detects the reference clock signal Ref and the feedback clock signal Clk, and outputs a control signal S2 to the SAR controller 46. When the SAR controller 46 receives the control signal S2, the SAR controller 46 is first initialized. Then, the SAR controller 46 controls the current calibration unit 45 according to the control signal S3 from the BBPD 43. The charge pump circuit 44 generates an up current to charge the loop filter 47 and a down current to discharge the loop filter. The current calibration unit 45 calibrates the up current or the down current according to the SAR controller 46. When the SAR controller 46 finishes the current calibration, the SAR controller 46 outputs the control signal S1 to control the switched-delay phase frequency detector 41 to select the first delay $T_d$. The charge pump circuit 44 receives and transforms the signals UP and DN into a current to charge loop filter 47. The loop filter 47 receives and transforms the current into a voltage corresponding to the signals UP and DN. The voltage-controlled oscillator 48 generates an output clock signal according to the voltage from the loop filter 47. Feedback divider 49 has a parameter N to generate the feedback clock signal Clk, wherein the period of the feedback clock signal Clk is N times the frequency of the output clock signal.

Figure 5:
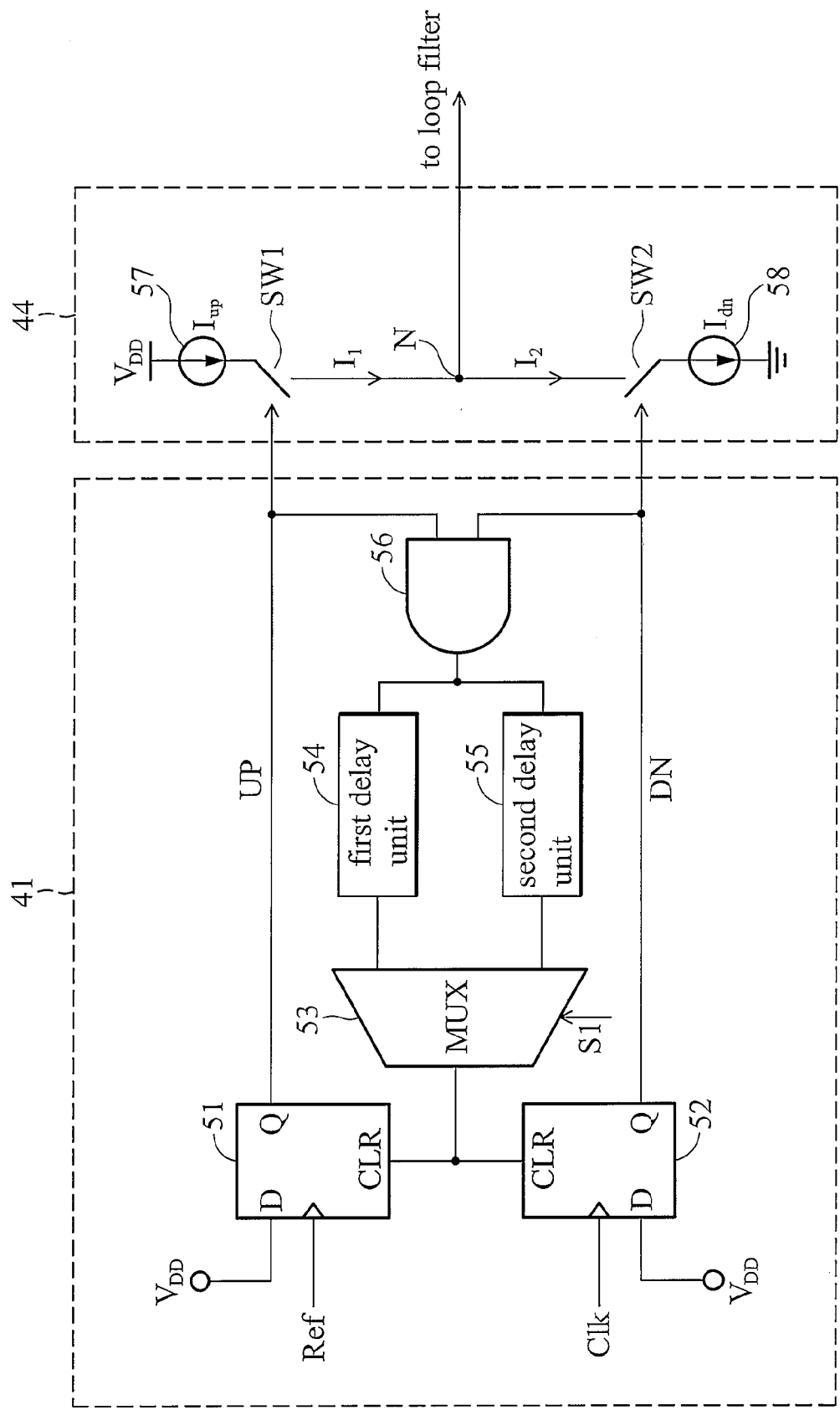
FIG. 5 is a block diagram of a phase frequency detector and a charge pump circuit according to an embodiment of the invention.

FIG. 5 is a block diagram of a phase frequency detector and a charge pump circuit according to an embodiment of the invention. The phase frequency detector 41 comprises a first D flip-flop 51, a second D flip-flop 52, a multiplexer 53, a first delay unit 54, a second delay unit 55 and an AND gate 56. The D inputs of the first D flip-flop 51 and the second D flip-flop 52 are connected to a high voltage $V_{DD}$. The clock inputs of the first D flip-flop 51 and the second D flip-flop 52 respectively receive the reference clock signal Ref and feedback clock signal Clk and respectively output the signals UP and DN, wherein the falling edge of the signal UP synchronizes with the falling edge of the signal DN. The AND gate 56 receives the signals UP and DN and outputs an output signal to the first delay unit 54 or the second delay unit 55. The first delay unit 54 delays the output signal from the AND gate 56 with a first delay and the second delay unit 55 delays the output signal from the AND gate 56 with a second delay, wherein the second delay is larger than the first delay. In some embodiment, the first delay is 1 nanosecond and the second delay is 20 nanoseconds.

The multiplexer 53 has two input terminals and an output terminal, wherein the two input terminals are respectively coupled to the output terminals of the first delay unit 54 and the second delay unit 55, and the output terminal is coupled to the first D flip-flop 51 and the second D flip-flop 52. The multiplexer 53 transmits the output data from the first delay unit 54 or the second delay unit 55 based on the control signal S1. In one embodiment, when the reference clock signal Ref synchronizes with the feedback clock signal Clk and the charge pump currents are calibrated, the phase frequency detector 41 selects the first delay unit, and when the reference clock signal Ref does not synchronize with the feedback clock signal Clk and the charge pump currents are not calibrated, the phase frequency detector 41 selects the second delay unit.

The charge pump circuit 44 comprises a first current source 57, a first switch SW1, a second switch SW2, and a second current source 58. The connections of the described elements are shown in FIG. 5 and are not described for brevity. In an ideal condition, the signals UP and DN simultaneously turn on and turn off the switches SW1 and SW2, however, if the currents generated by the first current source 57 an the second current source 58 are mismatched, such as described in paragraph [0005], the high-level pulse widths change to satisfy the equation (1).

Figure 6:
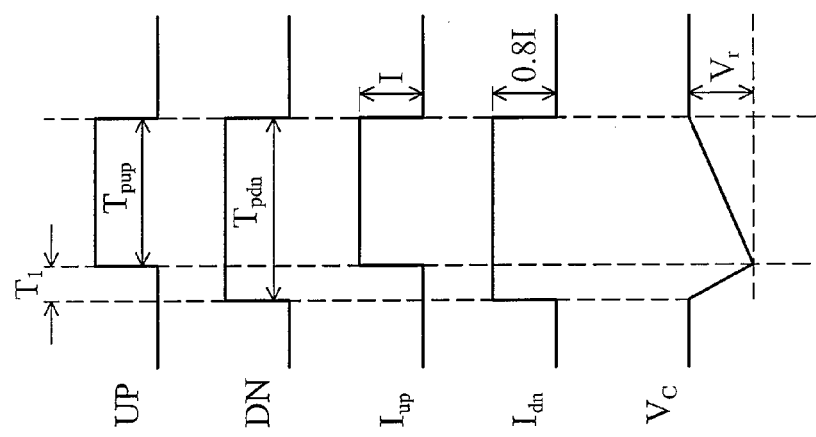
FIG. 6 is a timing diagram of the phase frequency detector 41 and the charge pump circuit 44 in FIG. 5.

Referring to FIG. 6, a timing diagram of the phase frequency detector 41 and the charge pump circuit 44 in FIG. 5 is illustrated. In FIG. 6, assume that the down current $I_{dn}$ is 80% of the up current $I_{up}$, and the high-level pulse widths of the signal UP and DN respectively are 1 nanosecond and 1.25 nanoseconds. In FIG. 6, we can find that the rising edge of the signal DN leads the signal UP, and this causes static error generated during the time period $T_1$. In an ideal situation, the voltage at the node N, Vc, should be constant. However, in the described condition, the voltage Vc shifts, and the shift voltage Vr causes the clock frequency of the output signal of the voltage-controlled oscillator shifts. This damages the performance of the PLL device.

Although we can adjust the high-level pulse widths of the signal UP and DN to satisfy the equation (1), it results in the static phase error. Therefore, the preferred method to calibrate the current mismatch is to directly calibrate the current in the charge pump circuit 44. Furthermore, we can use a bang-bang phase detector (BBPD) to detect the static phase error. When the bang-bang phase detector detects the phase error, it indicates that the current mismatch has occurred in the charge pump circuit 44.

In a conventional phase frequency detector, only one delay unit is applied. Taking the embodiment shown in FIG. 6 as an example, the static phase error is only 0.25 ns. Since the phase error is larger than the minimum detectable timing error of traditional BBPD, $\Delta t_{min}$, the calibration resolution is still not good enough. As for a conventional BBPD fabricated utilizing standard 0.18 µm CMOS technology, its minimum detectable timing error, $\Delta t_{min}$, is normally 50 µs. Namely, the calibration resolution is only 5% for the reset delay, $T_d$=1 ns.

To increase the calibration resolution, if one can multiply the normal reset delay, $T_d$, by a factor of 20, the static phase error would also be multiplied by the same factor and the calibration resolution would also be enhanced by 20. The resolution enhancement factor $A_{res}$ is defined as $$A_{res} = \frac{T_{d\_en}}{T_d} \quad (2)$$

wherein $T_{d\_en}$ represents the delay generated by the second delay unit 55 in FIG. 5 and the second delay $T_{d\_en}$ is 20 ns. However, the second delay $T_{d\_en}$ can not be increased indefinitely. The maximum reset delay for a PFD should be less than half of the period, $T_{ref}$, of the reference clock Ref to maintain a phase-locked system. Hence, the maximum achievable enhance factor, $A_{res\_max}$, is determined as $$A_{res\_max} = 0.5 \cdot \frac{T_{ref}}{T_d} \quad (3)$$

For a BBPD with a minimum detectable timing error, $\Delta t_{min}$, the calibration resolution, $R_{cal}$, is defined as $$R_{cal} = 1 - \frac{A_{res} \cdot T_d}{\Delta t_{min} + A_{res} \cdot T_d} \quad (4)$$

For example, assuming a phase-locked system with a reference clock of 10 MHz and a BBPD with a minimum detectable timing error, $\Delta t_{min}$=50 ps. According to equations. (2)-(4), the minimum calibration resolution is 0.05%.

However, if the phase frequency detector 41 continuously uses the second delay unit 55 with a longer delay time during the phase-locked period, it would reduce the performance of the PLL device. Thus, the inventions, 'novel' phase frequency detector 41 with two different delays is provided to solve the problem. When the PLL device is not locked and the charge pump currents are not calibrated, the control signal S1 controls the multiplexer 53 to select the second delay unit 55 with longer delay time. When the PLL device is locked, the control signal S1 controls the multiplexer 53 to select the first delay unit 53 with shorter delay time.

Figure 7:
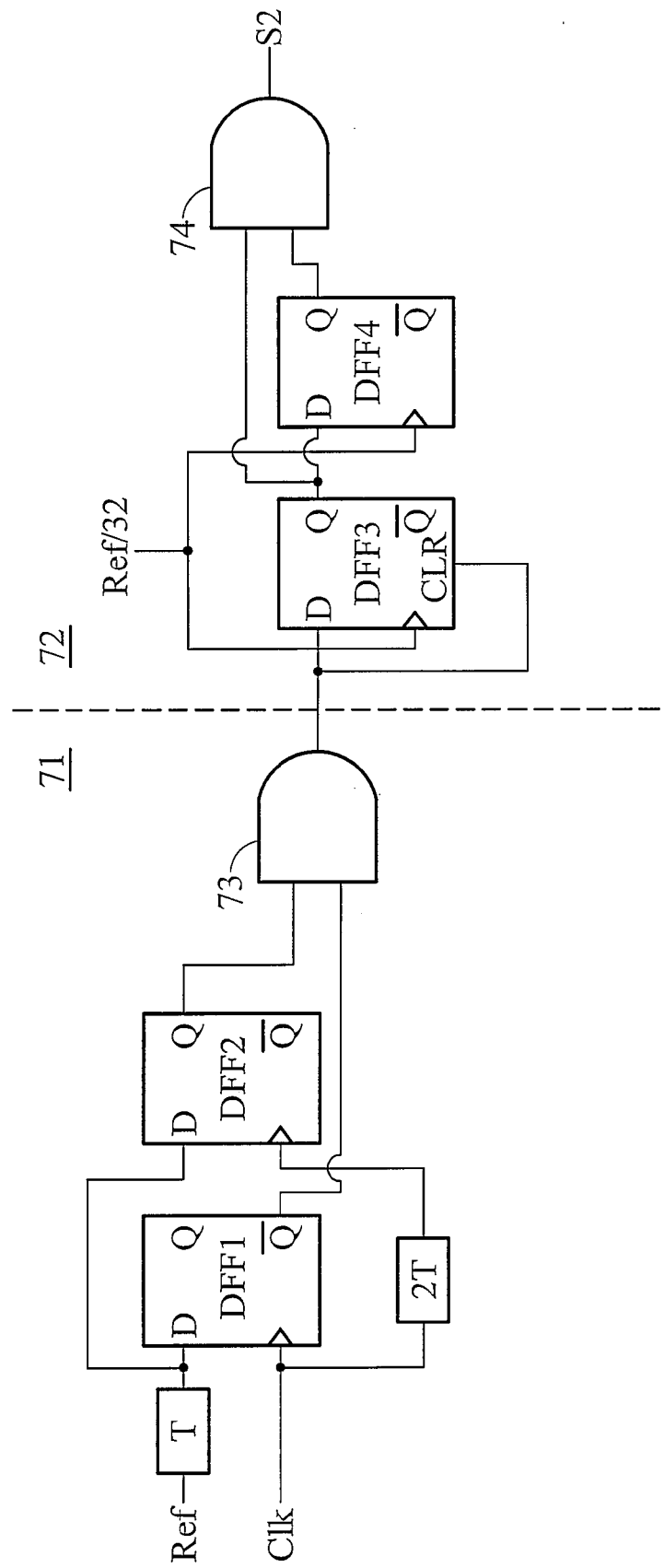
FIG. 7 is a schematic diagram of a lock detector according to an embodiment of the invention.

FIG. 7 is a schematic diagram of a lock detector according to an embodiment of the invention. The lock detector mainly comprises two parts, a conventional lock detector 71 and a deglitch unit 72. In the conventional lock detector 71, the output signal of the AND gate 73 may have glitches and cause faults. Therefore, the lock detector according to an embodiment of the invention adds the deglitch unit 72 to eliminate the glitches. The deglitch unit 72 comprises an AND gate 64 and two D flip-flops (DFF3 and DFF4). The DFF3 and DFF4 are triggered by a clock, which is divided by 32 from the reference clock signal Ref. In this embodiment, the number 32 is only taken as an example, and is not limited to the scope of the invention thereto. When the PLL is locked, in other words, the reference clock signal Ref synchronizes with the feedback clock signal Clk, the output of the AND gate 73 is high. The data terminal of DFF3 receives the output of the AND gate 73, wherein the output of DFF3 is high when the divided-by-32 clock signal is also high. If the output of the AND gate 73 becomes low before the next rising edge of the divided-by-32 clock signal, DFF3 will be reset, and the control signal S2 remains low. On the other hand, if the output of the conventional lock detector remains high till the next rising edge of the divided-by-32 clock signal, both the outputs of DFF3 and DFF4 is high and the control signal S2 becomes high to indicate a locked condition of the PLL device.

Figure 8:
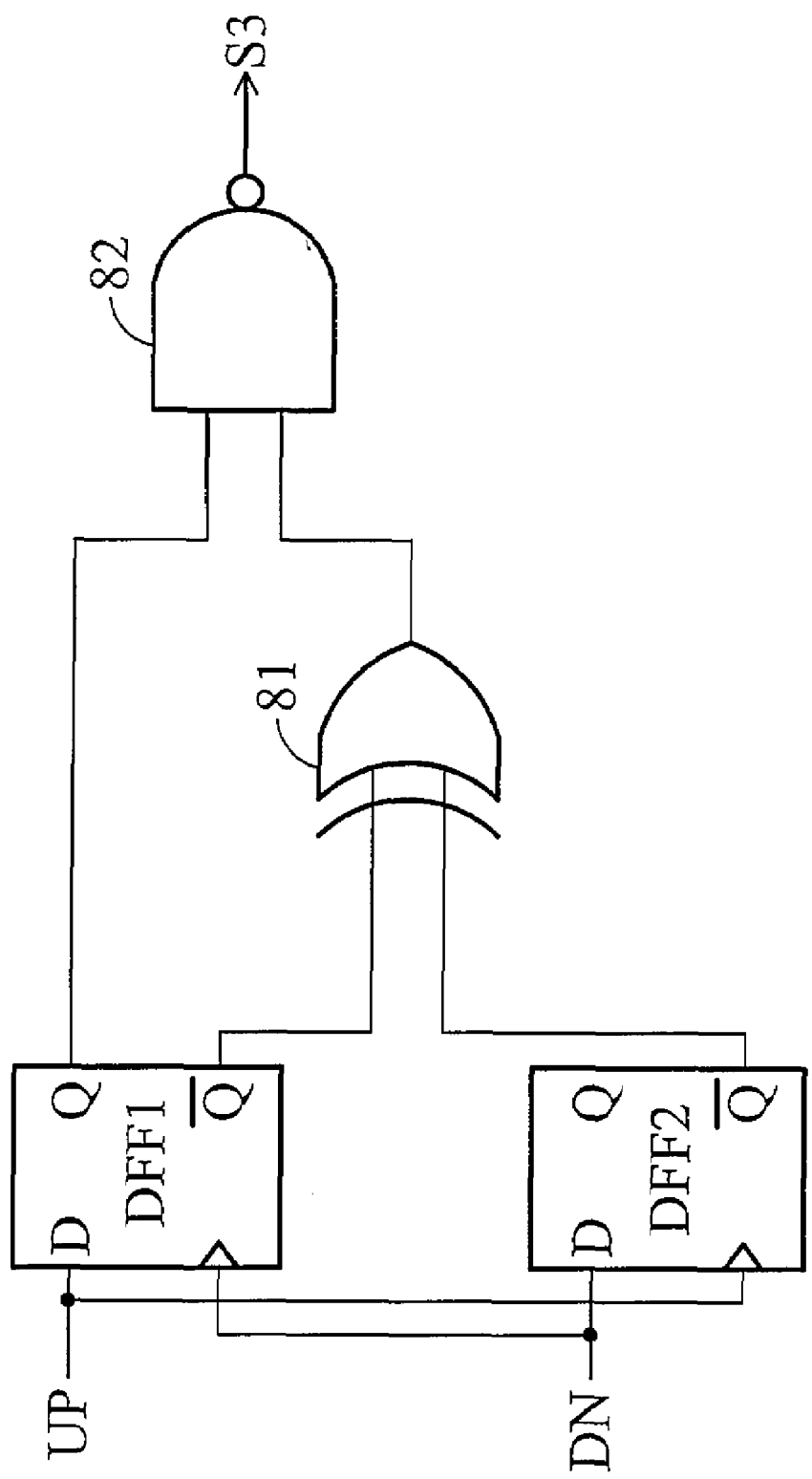
FIG. 8 is a schematic diagram of a BBPD according to an embodiment of the invention.

FIG. 8 is a schematic diagram of a BBPD according to an embodiment of the invention. The first D flip-flop (DFF 1) receives the signal UP via the D terminal and the signal DN via the clock terminal. The second D flip-flop receives signal DN via D terminal and the signal UP via the clock terminal. When a phase error is generated in the charge pump circuit, the output of the exclusive gate (XOR) 81 is logic "1". When the signal UP leads the signal DN, the output of the NAND gate 82 is logic "0", i.e. the signal S3 is at the low voltage level. When the signal DN leads the signal UP, the output of the NAND gate 82 is logic "1", i.e. the signal S3 is at the high voltage level. In an ideal condition, only one D flip-flop can serve as a simple BBPD to determine the phase relation between the signals UP and signal DN. However, in the described design, there is a finite sampling offset and an unbalanced capacitive load for signals UP and DN. In this embodiment, the BBPD detects the phase relation between the signals UP and DN and outputs the control signal S3 to the SAR controller 46 based on the detection result.

Figure 10:
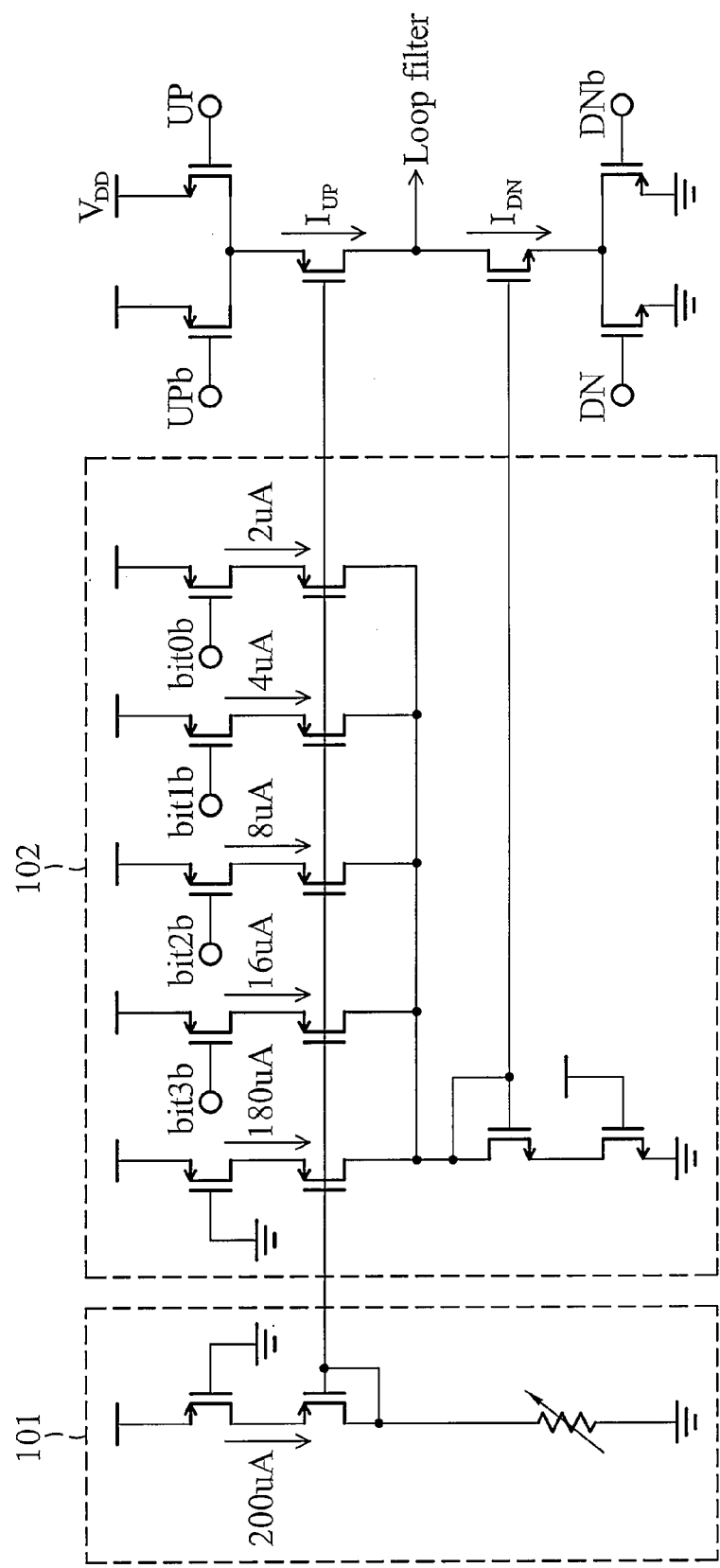
FIG. 10 is a circuit diagram of a charge pump circuit with current calibration circuit according to an embodiment of the invention.

FIG. 10 is a circuit diagram of a charge pump circuit with current calibration circuit according to an embodiment of the invention. The charge pump circuit comprises the first reference current source 101 and the second reference current source 102. The first reference current source 101 provides the up current $I_{up}$ and the second reference current source 102 provides the down current $I_{down}$. In this embodiment, the up current $I_{up}$ is fixed to 200 µA and the down current $I_{down}$ is within the range from 180 µA to 210 µA. When the BBPD 43 detects a static phase error in the charge pump circuit 44, the BBPD 43 outputs the control signal S3 to the SAR controller 46, and the bit0$b$~bit3$b$ in the second reference current source 102 are set to logic "1". The SAR controller 46 outputs the logic value of the bit0$b$~bit3$b$ based on the comparison result of the signals UP and DN. In this embodiment, the up current $I_{up}$ is 200 µA, and to avoid the current mismatch, the second reference current source 102 should provide the down current $I_{down}$ with 200 µA. To achieve that, the logic values of bit0$b$~bit3$b$ are [1, 0, 1, 0].

Figure 9:
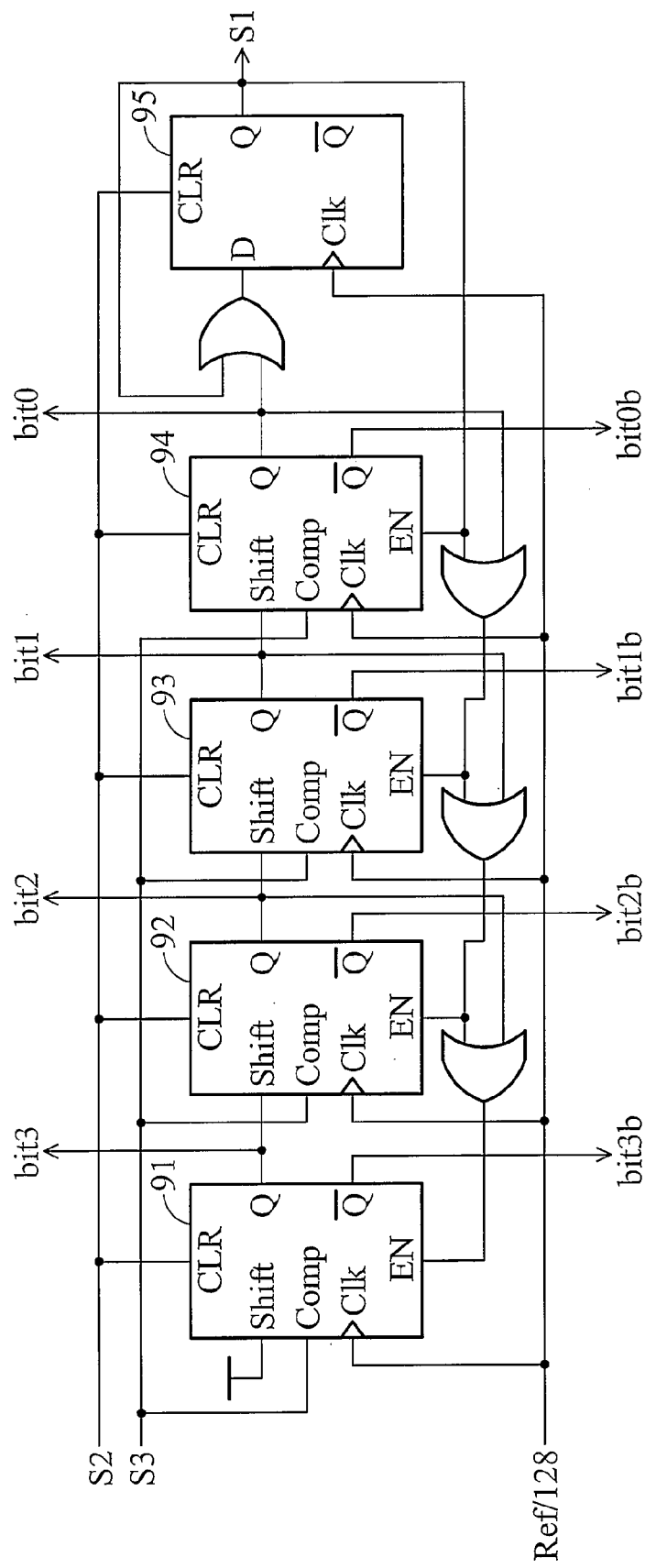
FIG. 9 is a schematic diagram of a SAR controller according to an embodiment of the invention.

FIG. 9 is a schematic diagram of a SAR controller according to an embodiment of the invention. When the lock detector 42 detects that the PLL device is not locked, the lock detector 42 outputs the control signal S2 to enable the SAR controller illustrated in FIG. 9. When the SAR controller receives the control signal S2, i.e. the control signal S2 is logic high, the bits 0 to 3 are reset to logic "0". When the SAR controller receives the control signal S3 from the BBPD 43, the first SAR cell 91 is enabled and the bit3 will be logic "1" or logic "0" based on the comparison result, i.e. the control signal S3. When the bit 3 is determined, the second SAR cell 92 is enabled. As to the operation of the SAR cells 92 to 94, it is similar to the operation of the SAR cell 91 and will not be described below for brevity. When the SAR controller finishes a current calibration procedure, the D flip-flop 95 outputs the control signal S3 to the switched-delay PFD 41 and the switched-delay PFD 41 selects the first delay unit 54 with shorter delay time.

Figure 11:
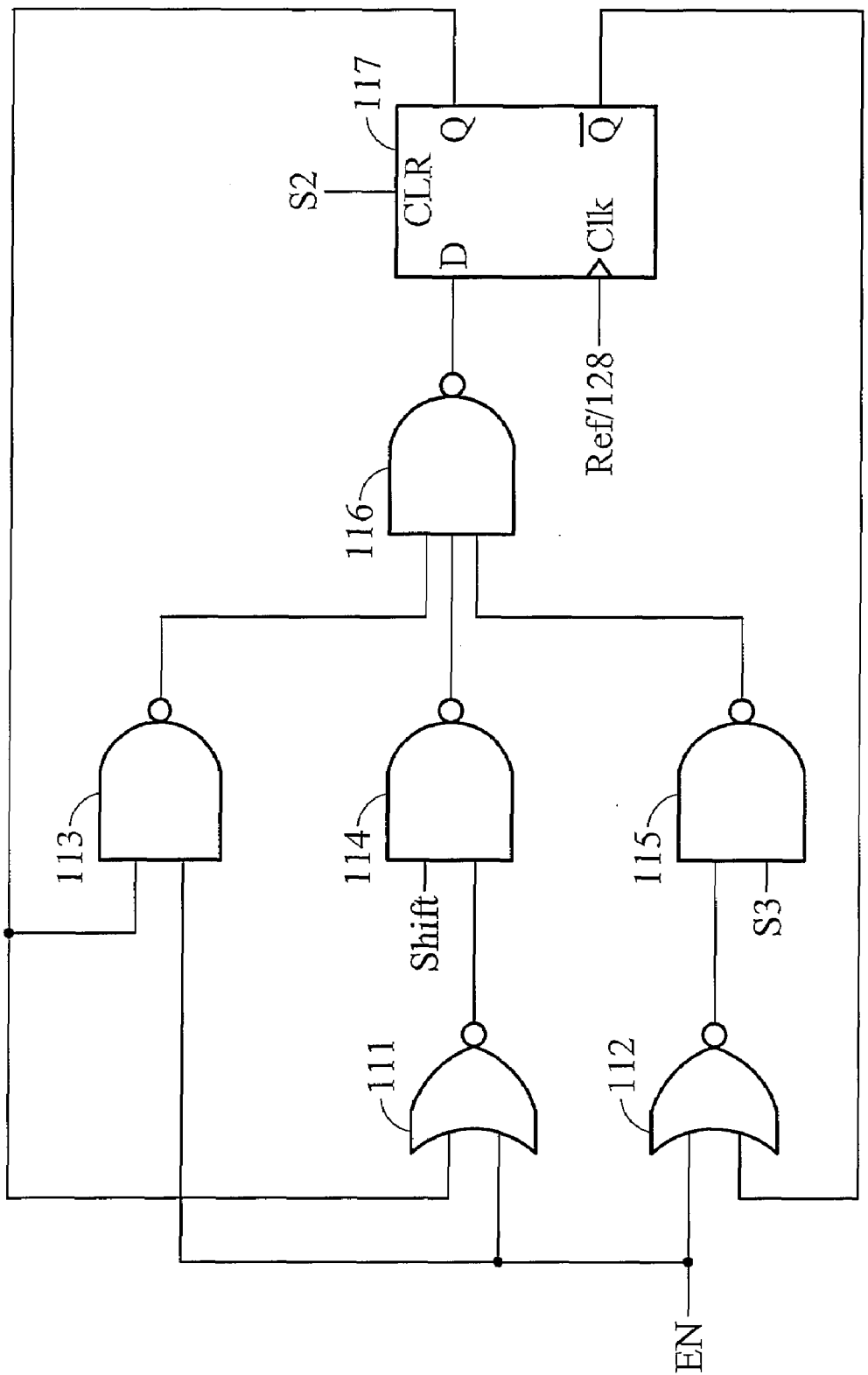
FIG. 11 is a schematic diagram of a SAR cell according to an embodiment of the invention.

FIG. 11 is a schematic diagram of a SAR cell according to an embodiment of the invention. The NOR gate 111 receives the output signal from the Q terminal of the D flip-flop 117 and the signal EN. The NOR gate 112 receives the output signal from the $\overline{Q}$ terminal of the D flip-flop 117 and the signal EN. The NAND gate 133 receives the output signal from the Q terminal of the D flip-flop 117 and the signal EN. The NAND gate 114 has two input terminals, wherein one terminal serves as the Shift terminal and the other terminal receives the output signal of the NOR gate 111. If the SAR cell is used to output the most signal bit (MSB), such as the bit 3 in the FIG. 9, the Shift terminal is connected to a high voltage source. If the SAR cell is not used to output the most signal bit (MSB), the Shift terminal is connected to the D terminal of a previous SAR cell. The NAND gate 115 has two input terminals, wherein one terminal serves as the Comp terminal to receive the control signal S3 and the other input terminal receives the output signal of the NOR gate 112. The NAND gate 116 receives the output signals from the NAND gate 113, NAND 114 and NAND 115 to output a signal to the D terminal 117. The CLR terminal receives the control signal S2, and when the control signal S2 is changed to high, the output signal output via the Q terminal is set to logic "0".

The period of the clock in the 4-bit SAR controller is an important parameter. If the clock period is too short, the synthesizer remains unsteady and the BBPD may fail to provide the correct information. Conversely, if the clock period is too long, the total calibration time increases dramatically. As a result, it is necessary to choose an appropriate clock period for the calibration system. Since the CP is switched during the calibration transient, the synthesizer may experience the phase acquisition. As shown in FIG. 10, the largest current step in the down current is 16 μA. In the following analysis, the appropriate clock period for the calibration technique is derived.

Assuming the synthesizer is locked before the down current is switched and it is modeled as a linear system. A sudden current change, $I_{incr}$, of the down current is modeled as a phase step, $\theta_{step}$, as $$\theta_{step} = \left( \frac{\frac{I_{up}}{I_{dn\_min}} \cdot T_{d\_en} - \frac{I_{up}}{I_{dn\_min} + I_{incr}} \cdot T_{d\_en}}{T_{ref}} \right) \cdot 2\pi \quad (6)$$

where $I_{dn\_min}$ means the smallest down current in the beginning of the calibration process. Let $I_{up}$, $I_{dn\_min}$, $I_{incr}$, $T_{d\_ehn}$, and $T_{ref}$ be 200 μA, 180 μA, 16 μA, 20 ns, and 100 ns, respectively. According to eq. (6), the phase step is calculated as $\theta_{step}$=0.114 rad or 6.5°.

The phase transfer function, H(s), of the frequency synthesizer on phase domain is shown as $$H(s) = \frac{\theta_{out}(s)}{\theta_{in}(s)} = \frac{N \cdot \omega_C \cdot (s + \omega_Z)}{\frac{s^3}{\omega_P} + s^2 + \omega_C \cdot s + \omega_C \cdot \omega_Z} \quad (7)$$

where $$\omega_P = \frac{C_1 + C_2}{C_1 \cdot C_2 \cdot R_2}; \quad \omega_Z = \frac{1}{R_2 \cdot C_2}; \quad \omega_C = \frac{I_{cp} \cdot K_{vco} \cdot R_2 \cdot C_2}{N \cdot (C_1 + C_2)}$$

and $I_{cp}$, $K_{VCO}$, and N denote the nominal charge pump current, the VCO gain, and division ratio, respectively. To simplify the analysis, the system is designed with the maximum phase margin at the unity gain frequency, i.e., $$\gamma \equiv \frac{\omega_C}{\omega_Z} = \frac{\omega_P}{\omega_C}.$$

Then the phase error transfer function, $H_e(s)$, between the phase error and input phase is expressed as $$H_e(s) = 1 - \frac{H(s)}{N} = \frac{s^3 + \omega_C \cdot \gamma \cdot s^2}{s^3 + \omega_C \cdot \gamma \cdot s^2 + \omega_C^2 \cdot \gamma \cdot s + \omega_C^3} \quad (8)$$

Finally, the step response of the phase error, $\theta_{e\_sr}(s)$, can be derived as $$\theta_{e\_sr}(s) = \frac{\theta_{step}}{s} \cdot H_e(s) = \frac{\theta_{step} \cdot (s^2 + \omega_c \cdot \gamma \cdot s)}{s^3 + \omega_C \cdot \gamma \cdot s^2 + \omega_C^2 \cdot \gamma \cdot s + \omega_C^3} \quad (9)$$

The stability of the system is heavily related to the value of γ. In order to have a well-controlled settling behavior, phase margin of 64° and γ of 4.5 are chosen. It ensures that there is no under-damping settling behavior. If γ>3, eq. (9) can be further decomposed into eq. (10) as $$\theta_{e\_sr}(s) = \frac{\theta_{step} \cdot (1 - \gamma)/(3 - \gamma)}{s + \alpha_1} + \frac{\theta_{step}/(3 - \gamma)}{s + \alpha_2} + \frac{\theta_{step}/(3 - \gamma)}{s + \alpha_3} \quad (10)$$

where $$\alpha_1 = \omega_C, \quad \alpha_2 = \frac{(\gamma - 1 - \sqrt{\gamma^2 - 2\gamma - 3})}{2} \cdot \omega_C, \text{ and}$$

$$\alpha_3 = \frac{(\gamma - 1 + \sqrt{\gamma^2 - 2\gamma - 3})}{2} \cdot \omega_C.$$

We also know that $\alpha_1$, $\alpha_2$, and $\alpha_3$ are positive real numbers for γ>3. Now we can derive the step response of the phase error in the time domain:

$$\theta_{e\_sr}(t) = \frac{\theta_{step} \cdot (1 - \gamma)}{(3 - \gamma)} \cdot e^{-\alpha_1 \cdot t} + \frac{\theta_{step}}{(3 - \gamma)} \cdot e^{-\alpha_2 \cdot t} + \frac{\theta_{step}}{(3 - \gamma)} \cdot e^{-\alpha_3 \cdot t} \quad (11)$$

Figure 12:
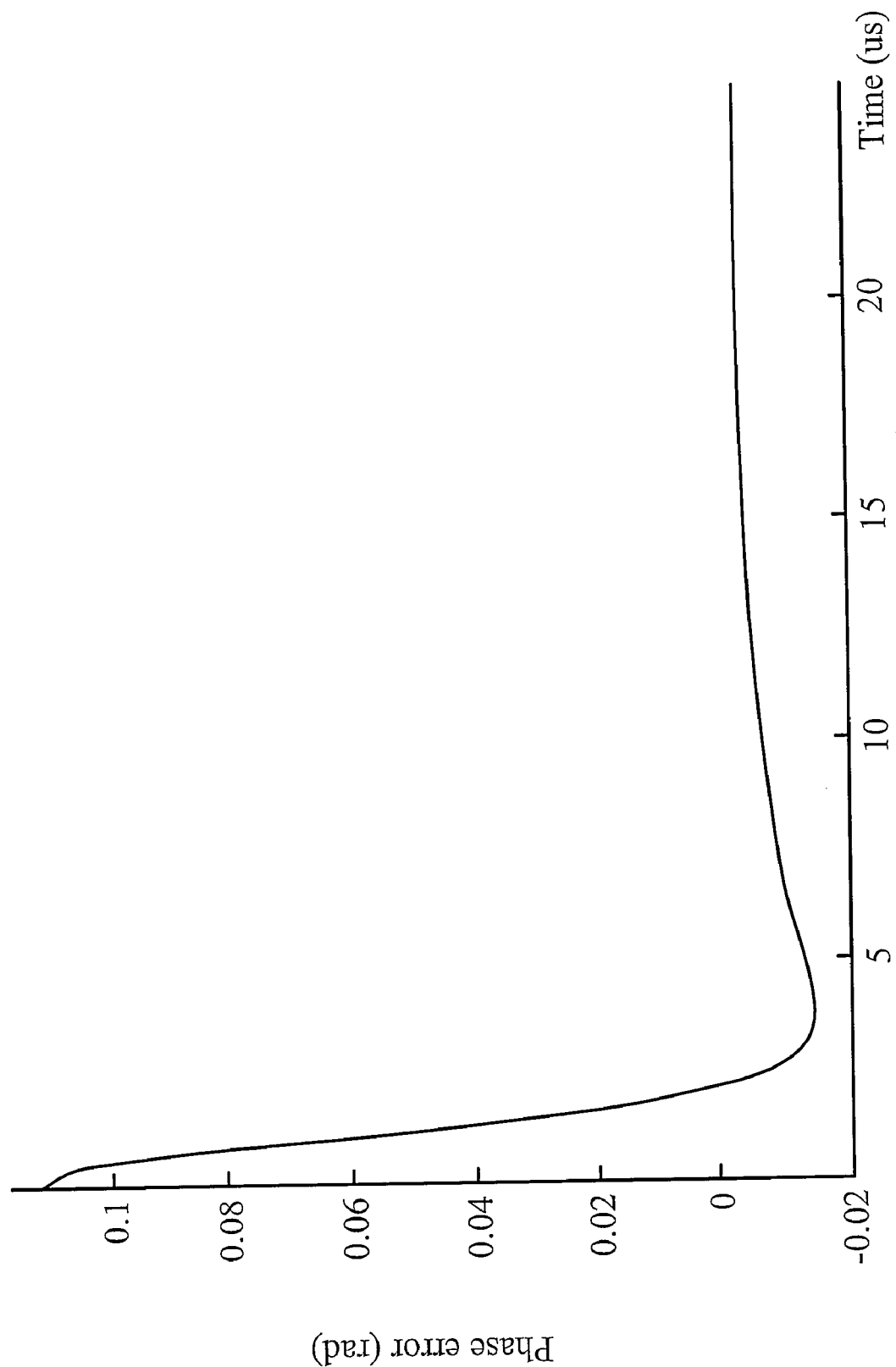
FIG. 12 is a diagram showing the response of the phase error.

Substituting the corresponding values of this synthesizer into eq. (11), the step response of the phase error is shown in FIG. 12. Referring to FIG. 10 and eq. (6), the smallest phase step, $\theta_{step\_min}$, is 0.015 rad when the system experiences a 2 μA down current change in the CP. Referring to FIG. 12, a calibration period larger than 4 μs is good enough for a phase error smaller than $\theta_{step\_min}$ to ensure the calibration resolution. Taking process and temperature variations into consideration as well, the reference clock is divided by 128 to have a calibration period of 12.8 μs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-locked loop device, comprising:
   a phase frequency detector, the phase frequency detector comprising:
      a first D flip-flop receiving a reference signal to output an up signal;
      a second D flip-flop receiving a clock signal to output a down signal;
      a first delay unit with a first delay; and
      a second delay unit with a second delay;
   a charge pump circuit receiving and transforming the up signal and the down signal into a current;
   a loop filter receiving and transforming the current into a voltage; and
   a voltage-controlled oscillator receiving the voltage and outputting the clock signal,
   wherein when the reference signal synchronizes with the clock signal and the charge pump currents are calibrated, the high-level pulse widths of the up signal and the down signal are determined based on a first delay, and when the reference signal does not synchronize with the clock signal and the charge pump currents are not calibrated, the high-level pulse widths of the up signal and the down signal are determined based on a second delay.

2. The device as claimed in claim 1, wherein the second delay is larger than the first delay.

3. The device as claimed in claim 1, further comprising a lock detector receiving a reference signal and a clock signal to output a phase-locked signal.

4. The device as claimed in claim 1, further comprising an AND gate comprising two input terminals and an output terminal, wherein the two input terminals respectively receive the up signal and the down signal, and the output terminal is coupled to the first delay unit and the second delay unit.

5. The device as claimed in claim 4, wherein the AND gate outputs a reset signal to reset the first D flip-flop and the second D flip-flop in accordance with the first control signal and the second control signal.

6. The device as claimed in claim 1, further comprising a multiplexer comprising two input terminals and an output terminal, wherein the two input terminals are respectively coupled to the output of the first delay unit and the second delay unit, and the output terminal is coupled to the first D flip-flop and the second D flip-flop.

7. The device as claimed in claim 6, wherein the multiplexer outputs a reset signal to reset the first D flip-flop and the second D flip-flop according to the signal from the first delay unit or the second delay unit.

8. The device as claimed in claim 1, wherein the charge pump circuit comprises:
   a first current source coupled to a voltage source;
   a second current source coupled to ground; and
   a first switch and a second switch serially coupled between the first current source and the second current source.

9. The device as claimed in claim 8, wherein the first switch and the second switch are respectively controlled by the up signal and the down signal.

10. The device as claimed in claim 1, further comprising a current calibration unit to calibrate the current.

11. The device as claimed in claim 10, wherein the current calibration unit is controlled by a SAR controller.

12. The device as claimed in claim 11, further comprising a bang bang phase detector, wherein the bang bang phase detector receives the up signal and down signal and outputs a control signal to the SAR controller.

13. The device as claimed in claim 12, wherein the SAR controller is controlled by a locked detector.

14. The device as claimed in claim 13, wherein the SAR controller is enabled when the SAR controller receives a phase-locked signal from the locked detector, and the SAR controller is disabled when the charge pump calibration procedures are finished.

15. A phase frequency detector, comprising:
   a first D flip-flop receiving a reference signal to output an up signal;
   a second D flip-flop receiving a clock signal to output a down signal;
   a first delay unit with a first delay; and
   a second delay unit with a second delay, wherein when the reference signal synchronizes with the clock signal and the charge pump currents are calibrated, the high-level pulse widths of the up signal and the down signal are determined based on the first delay, and when the reference signal does not synchronize with the clock signal and the charge pump currents are not calibrated, the high-level pulse widths of the up signal and the down signal are determined based on the second delay.

16. The detector as claimed in claim 15, wherein the second delay is larger than the first delay.

17. The device as claimed in claim 16, further comprising an AND gate comprising two input terminals and an output terminal, wherein the two input terminals respectively receive the up signal and the down signal, and the output terminal is coupled to the first delay unit and the second delay unit.

18. The device as claimed in claim 17, wherein the AND gate outputs a reset signal passing through the first delay unit, the second delay unit, and a multiplexer to reset the first D flip-flop and the second D flip-flop in accordance with the first control signal and the second control signal.

19. The device as claimed in claim 15, further comprising a multiplexer comprising two input terminals and an output terminal, wherein the two input terminals are respectively coupled to the output of the first delay unit and the second delay unit, and the output terminal is coupled to the first D flip-flop and the second D flip-flop.

20. The device as claimed in claim 15, wherein the multiplexer outputs a reset signal to reset the first D flip-flop and the second D flip-flop according to the signal from the first delay unit or the second delay unit.

* * * * *